United States Patent [19]
Nagari et al.

[11] Patent Number: 6,140,951
[45] Date of Patent: Oct. 31, 2000

[54] DOUBLE SAMPLED SWITCHED CAPACITOR LOW PASS MULTIRATE FILTER FOR A ΣΔ D/A CONVERTER

[75] Inventors: Angelo Nagari, Cilavegna; Germano Nicollini, Piacenza, both of Italy

[73] Assignee: STMicroelectronics S.r.l., Agrate Brianza, Italy

[21] Appl. No.: 09/152,719

[22] Filed: Sep. 14, 1998

[30] Foreign Application Priority Data

Sep. 19, 1997 [EP] European Pat. Off. .............. 97830458

[51] Int. Cl.$^7$ ...................................... H03M 3/00
[52] U.S. Cl. ............................................. 341/143
[58] Field of Search ................................. 341/143, 144

[56] References Cited

U.S. PATENT DOCUMENTS

| | | | |
|---|---|---|---|
| 5,153,593 | 10/1992 | Walden et al. | 341/143 |
| 5,305,004 | 4/1994 | Fattaruso | 341/143 |
| 5,325,399 | 6/1994 | Haspeslagh et al. | 341/143 |
| 5,489,903 | 2/1996 | Wilson et al. | 341/144 |
| 5,635,936 | 6/1997 | Rybicki | 341/144 |
| 5,821,891 | 10/1998 | Shi et al. | 341/143 |
| 5,949,361 | 9/1999 | Fischer et al. | 341/143 |

FOREIGN PATENT DOCUMENTS

WO 94/23494  10/1994  WIPO .............................. H03H 19/00

OTHER PUBLICATIONS

Le Toumelin, et al., "*A 5–V CMOS Line Controller With 16–Bit Audio Converters,*" IEEE Custom Integrated Circuits Conference, May 12, 1991, pp. 24.5.1–25.5.5.

Chung–Yu Wu, et al., "*Design Techniques for High–Frequency CMOS Switched–Capacitor Filters Using Non–Op–Amp –Based Unity–Gain Amplifiers,*" IEEE Journal of Solid–State Circuits, vol. 26, No. 10, Oct. 1, 1991.

*Primary Examiner*—Trong Phan
*Attorney, Agent, or Firm*—Theodore E. Galanthay; Allen, Dyer, Doppelt, Milbrath & Gilchrist, P.A.

[57] ABSTRACT

A ΣΔ digital/analog converter includes a signal reconstructing multirate low pass filter realized as a switched capacitor fully differential, double sampled structure. The input stage of the filter employs only two sampling capacitors, switched alternately on the two inputs of the stage. The input stage further includes two delay circuits ($z^{-1}$) in the feed line of the bitstream towards one of the two inputs of the multistage SC filter. The zeroes introduced in the transfer function reduce the noise energy in the vicinity of frequencies $f_s/2^n$, preserving the SNR even with a relatively large mismatch between the capacitors.

15 Claims, 4 Drawing Sheets

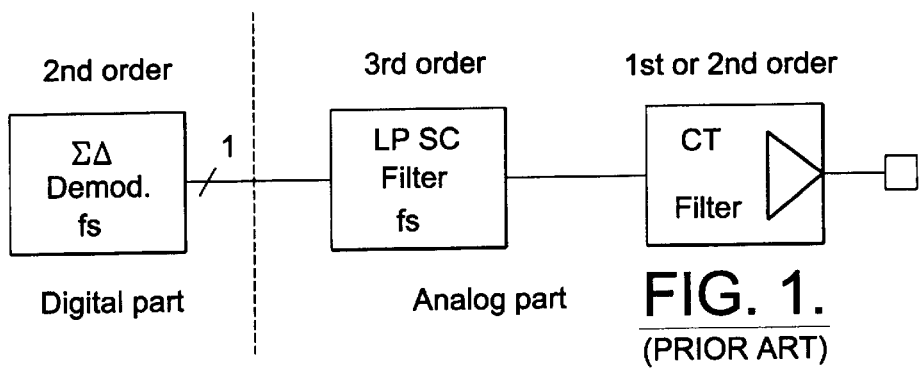
FIG. 1. (PRIOR ART)
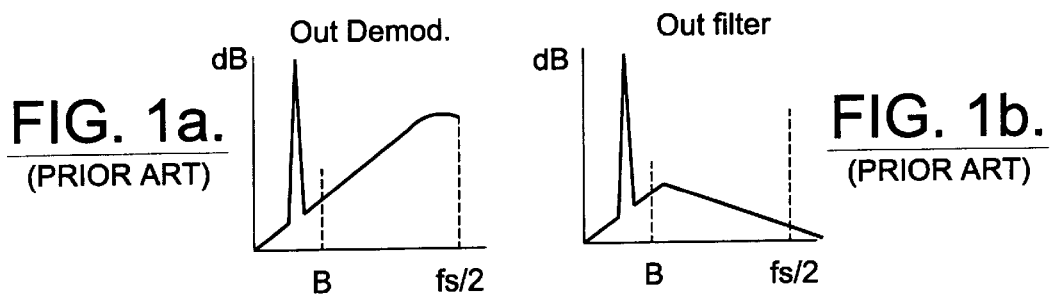
FIG. 1a. (PRIOR ART)
FIG. 1b. (PRIOR ART)
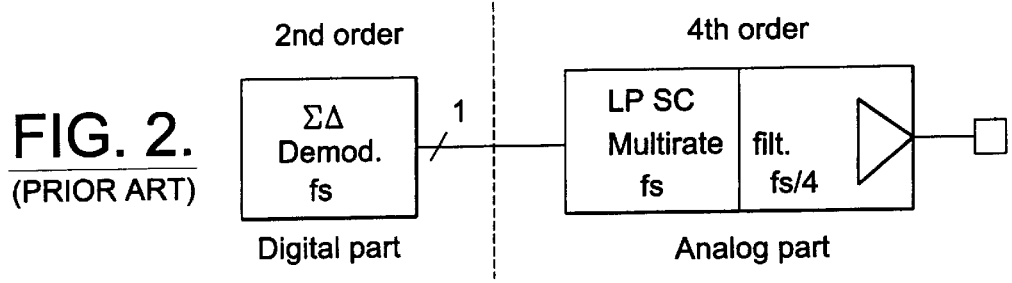
FIG. 2. (PRIOR ART)
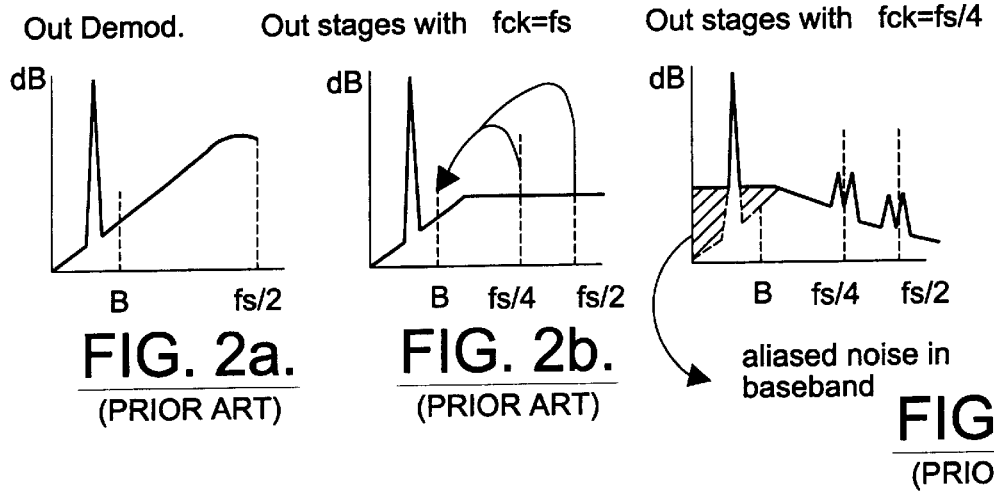
FIG. 2a. (PRIOR ART)
FIG. 2b. (PRIOR ART)
FIG. 2c. (PRIOR ART)

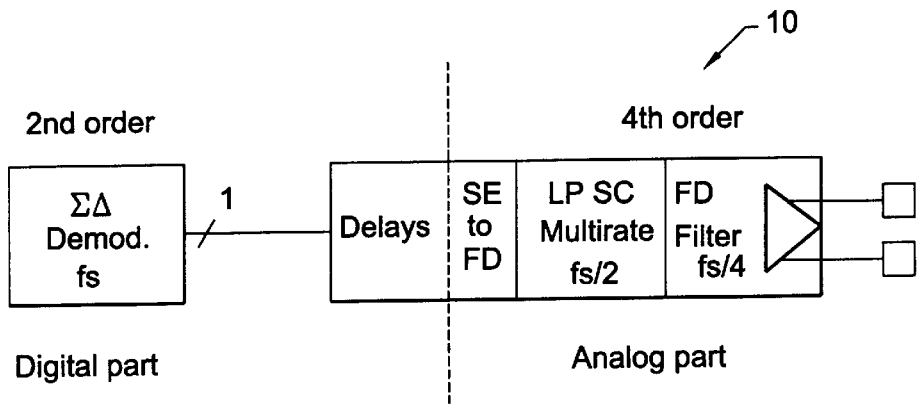
FIG. 3.
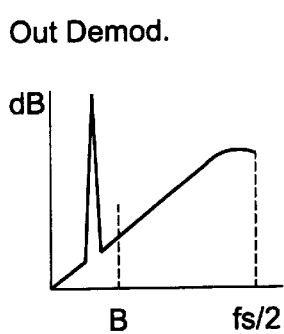
FIG. 3a.
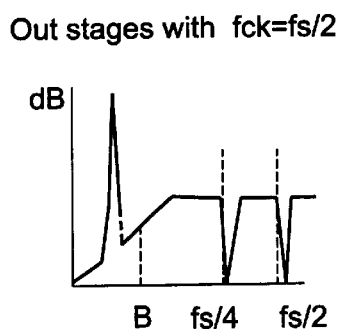
FIG. 3b.
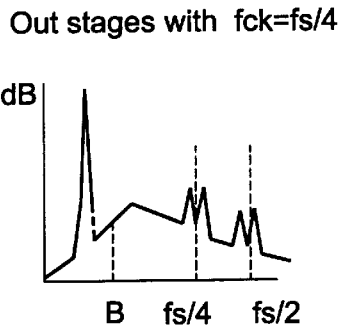
FIG. 3c.
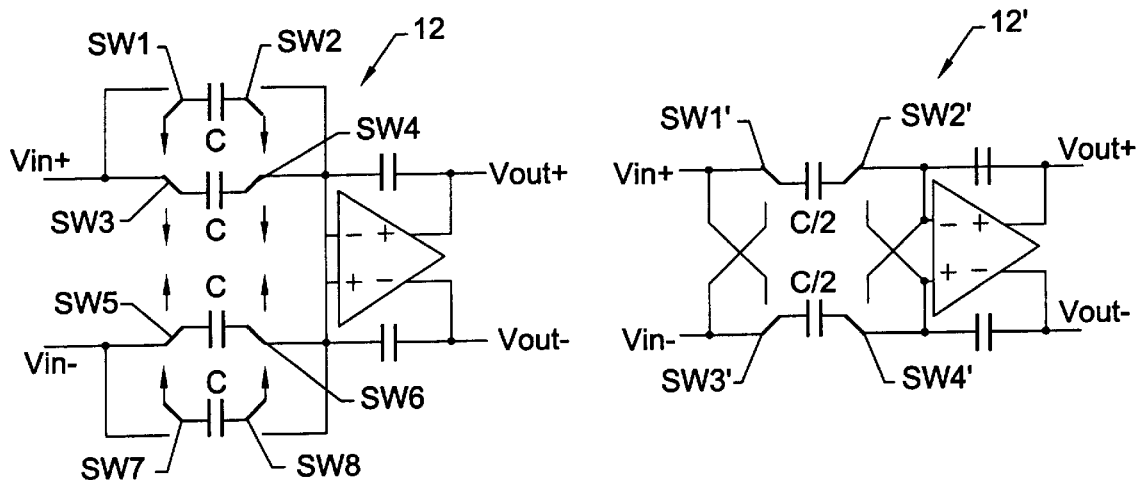
FIG. 4a.
(PRIOR ART)
FIG. 4b.

DOUBLE SAMPLED SWITCHED CAPACITOR LOW PASS MULTIRATE FILTER FOR A ΣΔ D/A CONVERTER

FIELD OF THE INVENTION

The invention relates in general to sigma-delta (ΣΔ) digital-analog (D/A) converters, and, more particularly, to the analog part of the converter that includes a low pass filter for reconstructing the analog signal from the digital output stream of the ΣΔ demodulator.

BACKGROUND OF THE INVENTION

As illustrated in FIG. 1, a ΣΔ digital-analog converter must be necessarily followed by a low pass filter LP SC to reconstruct the signal from the output bitstream of the ΣΔ demodulator of the D/A converter. There are many approaches that combine switched-capacitor techniques (SC) with continuous-time (CT) techniques. The typical approach used for implementing the low pass filter in ΣΔ digital-analog converters is to use a cascade of two filters. The first filter LP SC is formed with a SC technique of an order $\geq 2$ functioning with a clock frequency $f_s$, equal to the frequency of the output bitstream data of the ΣΔ demodulator.

The second filter CT is usually realized with a CT technique to eliminate the "imaging" in the vicinity of the $f_s$ frequency and, if required, to drive through the filter's last stage the chip external outputs. The second filter CT usually occupies a large area because of the large time constants that are normally realized with integrated resistors and capacitors according to the scheme shown in FIG. 1, whose spectral response diagrams are illustrated in FIGS. 1a and 1b.

In non-audio applications, where rejection of the clock frequency imaging about $f_s$, is not required, an efficient approach is to use a "multirate" fully SC filter, that is, a filter of order $\geq 3$ whose first stages operate with a clock frequency $f_s$, equal to $f_s$, whereas the last stages have a clock frequency $f_s$, equal to $f_s/2^n$ (n=1,2,3, ... ). In this way, the last stage of the filter LP SC may function simultaneously as an off-chip buffer without excessive power consumption. Indeed, the use of an SC buffer with a clock frequency equal to $f_s$, which is usually rather high because of the over-sampled nature of the output stream of the ΣΔ demodulator, is prohibitive for low-power applications.

The disadvantage of this approach is that in stages with a clock frequency equal to $f_s/2^n$, the noise occurring at those frequencies is brought back into the baseband (B) via aliasing.

The ΣΔ D/A input node that receives a signal with a high noise energy at frequencies well above the baseband (B) of the signal to be processed in the vicinity of $f_s/2^n$ causes such an energy density that aliasing of this noise in the baseband degrades the signal/noise ratio (SNR) of the reconstructing filter. This nullifies the beneficial effect of the ΣΔ conversion, as shown in the FIGS. 2, 2a, 2b and 2c.

Moreover, to further reduce the clock frequency and thus the power of the operational amplifiers, facilitating also the functioning of the output buffer, double sampled SC structures are often used. These structures are typically realized by duplicating each switched-capacitor and by inverting the associated control phases. However, this realization may introduce a further aliasing error equal to the mismatch among the input capacitances of alternate phases of the first input stage.

SUMMARY OF THE INVENTION

An effective approach to the above described problem is based on the placement of zeroes at an $f_s/2^n$ frequency, as well as at its multiples, before the signal reconstruction filter. In this manner the signal present at the input of the filter's first stage functioning with a clock frequency of $f_s/2^n$ has a spectrum that presents notches at the frequencies of purposely introduced zeroes, with a consequent reduction of the noise energy practically nullifying the aliasing in the baseband. A possible transfer function that attains this objective, assuming the case of n=2 is the following:

$$1+z^{-1}+z^{-2}+z^{-3}=(1+z^{-1})(1+z^{-2})$$

This function places zeroes at the frequencies $f_s/2$ and $f_s/4$, as it will be evident to one of skill in the art.

The different aspects and characteristics of the invention include the provision of a circuit that efficiently implements the above discussed transfer function.

BRIEF DESCRIPTION OF THE DRAWINGS

The features of the invention will be evidenced in the following description of preferred embodiments, also by referring to the attached drawings.

FIGS. 1, 1a and 1b show a typical block diagram of a ΣΔ D/A converter and the respective response spectra at the output of the ΣΔ demodulation stage and at the output of the signal reconstructing low pass filter according to the prior art.

FIGS. 2, 2a, 2b and 2c are respectively a block diagram of a ΣΔ D/A converter using a multirate reconstruction low pass filter of the $4^{th}$ order and the respective response spectra according to the prior art.

FIGS. 3, 3a, 3b and 3c show the block diagram and the spectral response diagrams of a ΣΔ D/A converter using a signal reconstruction multirate filter of the $4^{th}$ order, according to the present invention.

FIGS. 4a and 4b show respectively the circuit diagram of the input stage of the filter according to the prior art and according to an embodiment of the present invention.

DETAILED DESCRIPTION OF THE PREFERRED EMBODIMENTS

FIG. 3 shows the modification introduced to an input stage of a signal reconstruction low pass filter 10, according to the invention. The diagram highlights the presence of a stage of delay and conversion of the signal from a single-ended (SE) configuration to a fully differential (FD) configuration. FIGS. 3a, 3b and 3c show the respective diagrams of spectral response after the introduction of zeros at $f_s/2^n$ frequencies, according to the objectives of the invention.

As highlighted in FIG. 4b, the fully differential input stage 12' to the multirate signal reconstruction filter 10 is structured in a way to realize a double sampling without duplicating the input capacitors C/2 and switches SW1'–SW4' of this first stage. This is in contrast to using four input capacitors C and eight switches SW1–SW8 as in the conventional input stage 12 shown, by way of comparison, in FIG. 4a. Switches SW1'–SW4' define a means for inverting a connection of terminals of the two capacitors C/2.

Figure 5:
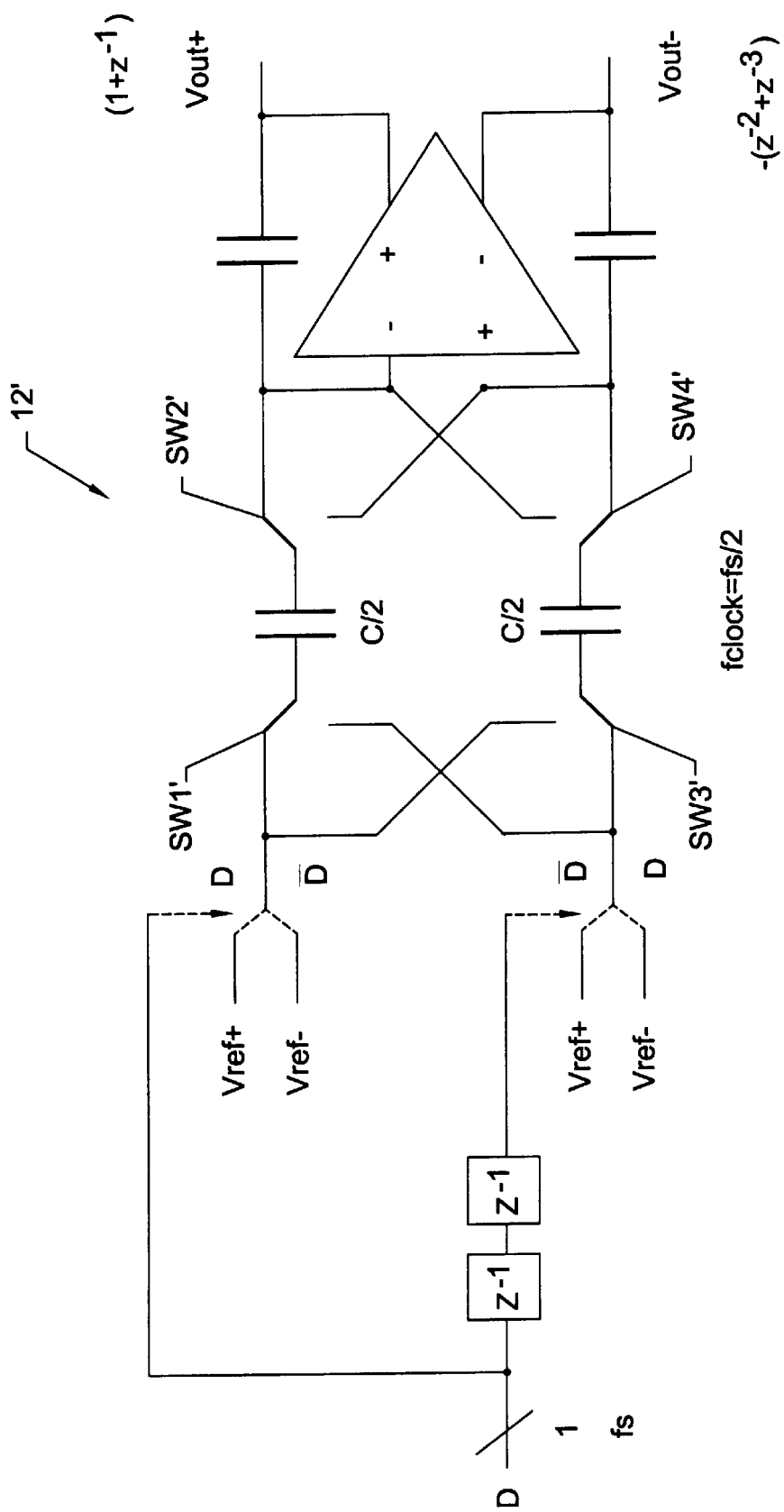
FIG. 5 shows the circuit scheme of a preferred embodiment of the first stage of the signal reconstruction low pass filter.

As more fully illustrated in the circuit diagram of FIG. 5, the first stage 12' of the filter uses two delay blocks ($z^{-1}$) of the digital output stream D of the ΣΔ demodulator of the digital/analog converter. This eliminates the aliasing phenomenon that is caused by the multirate topology.

Therefore, the fully differential (FD), double sampled, input structure of the SC signal reconstruction filter 12' of the invention performs double sampling without duplicating the input capacitors C/2 of the first stage of the filter. The input structure uses capacitors C/2 alternately on two inputs of the FD structure and advantageously eliminates the aliasing phenomenon caused by the mismatch among capacitors.

Simultaneously, such an input structure also realizes a SC bilinear transformation that automatically introduces a first notch at $f_s/2$. This is so because of the expression at the numerator of the transfer function of the structure of the invention:

$$1+z^{-1} \rightarrow \text{notch at } f_s/2$$

At this point, to introduce a second notch at $f_s/4$, it is simply required to add two delaying blocks $z^{-1}$ on one of the two inputs of the fully differential structure. This implements an expression at the numerator of the transfer function given by:

$$\frac{V_0^+ - V_0^-}{V} = \frac{N(z)P(z)}{D(z)} = \frac{1+z^{-1}+z^{-2}+z^{-3}}{D(z)} \cdot P(z)$$

where P(z)/D(z) is the denominator of the transfer function associated with the first stage of the filter.

The "in band" specifications of the multirate filter remain always assured by the necessary and sufficient condition for the synthesis of a SC filter, which notably is:

$$f_s/2^n >> B$$

where B is the useful band of the signals to be processed.

Figure 6:
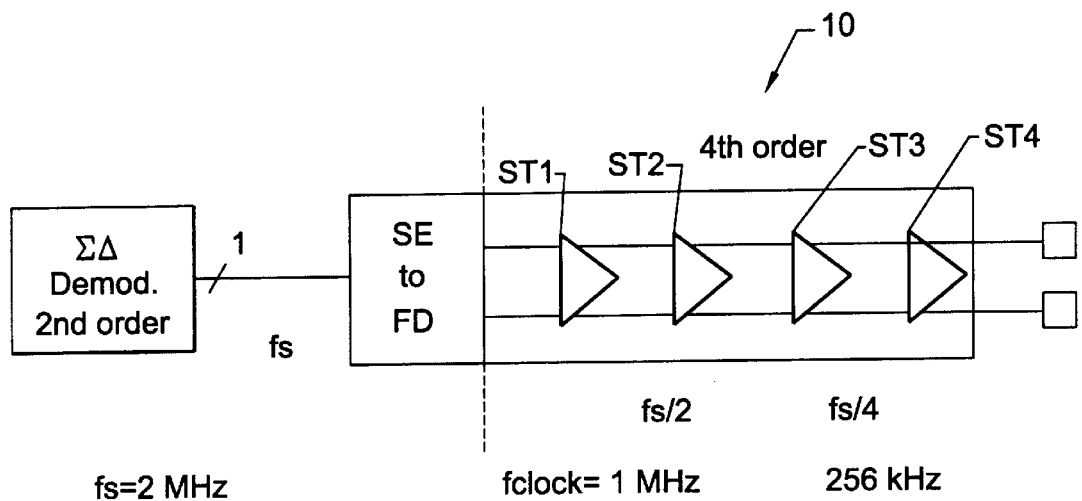
FIGS. 6, 6a and 6b are respectively a block diagram and the simulated response spectra relative to an embodiment of the invention.
Figure 6A:
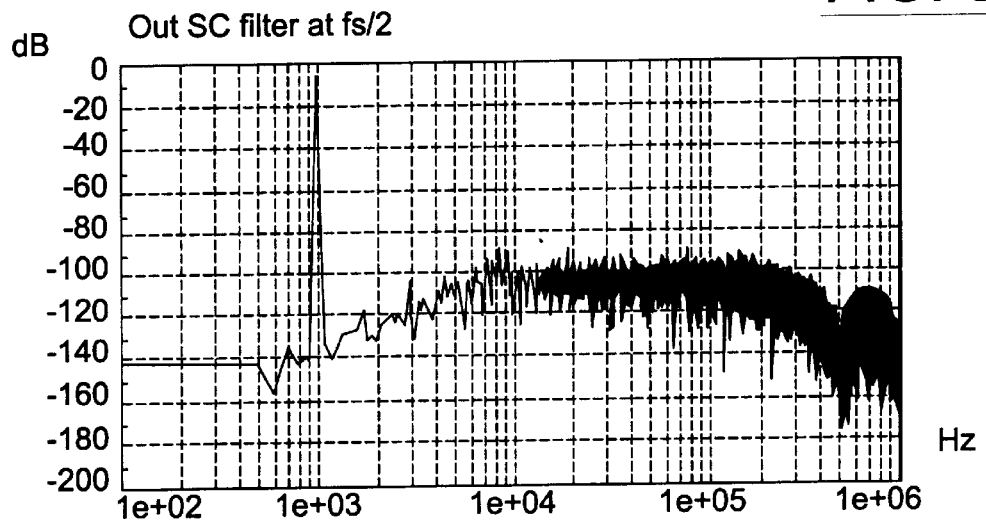
Figure 6B:
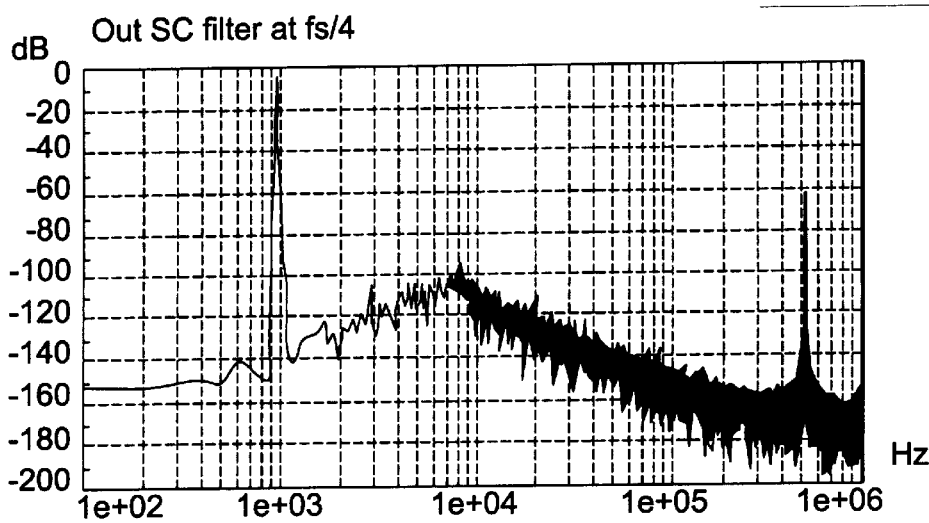

The diagram of a ΣΔ D/A converter realized according to the present invention is depicted in FIGS. 6, 6a and 6b. These figures illustrate the simulations for the converter of the invention fed with a bitstream with a frequency $f_s=2$ MHz having an SNR=96 dB for a signal band B=4 kHz ($2^{nd}$ order ΣΔ).

In the illustrated example the reconstructing filter 10 is a double sampled, ladder type, SC low pass filter of the $4^{th}$ order with the first two stages ST1, ST2 functioning with $f_{ck}=1$ MHz and the following two stages ST3, ST4 functioning with $f_{ck}=256$ kHz. The simulations demonstrate an unchanged SNR at the output of the filter even in the presence of a 1% mismatch between the input capacitors C/2.

What is claimed is:

1. A sigma-delta (ΣΔ) digital-analog converter comprising:
   a ΣΔ demodulation stage generating an output bitstream; and
   a multirate low pass filter for reconstructing an analog signal from the output bitstream of said ΣΔ demodulation stage, said multirate low pass filter comprising a switched capacitor fully differential, double sampled input stage having two inputs, said input stage comprising only two switched capacitors, means for inverting a connection of terminals of said two switched capacitors to the two inputs, and two delay blocks connected between said ΣΔ demodulation stage and one of the two inputs.

2. A sigma-delta (ΣΔ) digital-analog converter according to claim 1, wherein said delay blocks introduce zeroes in a transfer function of said multirate low pass filter at predetermined frequencies.

3. A sigma-delta (ΣΔ) digital-analog converter according to claim 1, wherein said multirate low pass filter further comprises at least one filter stage downstream from said input stage.

4. A sigma-delta (ΣΔ) digital-analog converter according to claim 3, wherein said delay blocks introduce zeroes in a transfer function of said multirate low pass filter at frequencies of $f_s/2^n$ where n is an integer number whose value is within a range of 1 to $n_{max}$, $f_s$ is a frequency of the output bitstream of said ΣΔ demodulation stage, and $f_s/2^{n_{max}}$ is the clock frequency of said at least one filter stage downstream from said input stage.

5. A sigma-delta (ΣΔ) digital-analog converter according to claim 4, wherein $f_s/2^n$ is greater than a band of signals to be processed.

6. A sigma-delta (ΣΔ) digital-analog converter comprising:
   a ΣΔ demodulation stage generating an output bitstream; and
   a multirate low pass filter for reconstructing an analog signal from the output bitstream of said ΣΔ demodulation stage, said multirate low pass filter comprising a switched capacitor fully differential, double sampled input stage having two inputs, said input stage comprising two switched capacitors, means for inverting a connection of terminals of said two switched capacitors to the two inputs, and a plurality of delay blocks connected between said ΣΔ demodulation stage and one of said two inputs for introducing zeroes in a transfer function of said multirate low pass filter at predetermined frequencies.

7. A sigma-delta (ΣΔ) digital-analog converter according to claim 6, wherein said two switched capacitors are only two in number.

8. A sigma-delta (ΣΔ) digital-analog converter according to claim 6, wherein said plurality of delay blocks are two in number.

9. A sigma-delta (ΣΔ) digital-analog converter according to claim 6, wherein said multirate low pass filter further comprises at least one filter stage downstream from said input stage.

10. A sigma-delta (ΣΔ) digital-analog converter according to claim 9, wherein said delay blocks introduce zeroes in a transfer function of said multirate low pass filter at frequencies of $f_s/2^n$ where n is an integer number whose value is within a range of 1 to $n_{max}$, $f_s$ is a frequency of the output bitstream of said ΣΔ demodulation stage, and $f_s/2^{n_{max}}$ is the clock frequency of said at least one filter stage downstream from said input stage.

11. A sigma-delta (ΣΔ) digital-analog converter according to claim 10, wherein $f_s/2^n$ is greater than a band of signals to be processed.

12. A sigma-delta (ΣΔ) digital-analog converter comprising:
   a ΣΔ demodulation stage generating an output bitstream; and
   a multirate low pass filter for reconstructing an analog signal from the output bitstream of the ΣΔ demodulation stage, said multirate low pass filter comprising a switched capacitor fully differential, double sampled input stage having two inputs, said input stage comprising two switched capacitors, means for inverting a connection of terminals of said two switched capacitors to the two inputs, and two delay blocks connected between said ΣΔ demodulation stage and one of said two inputs, and at least one filter stage downstream from said input stage, said delay blocks introducing zeroes in a transfer function of said multirate low pass filter at frequencies of $f_s/2^n$ where n is an integer number whose value is within a range of 1 to $n_{max}$, $f_s$ is a frequency of the output bitstream of said $\Sigma\Delta$ demodulation stage, and $f_s/2^{nmax}$ is the clock frequency of said at least one filter stage downstream from said input stage.

13. A sigma-delta ($\Sigma\Delta$) digital-analog converter according to claim 12, wherein $f_s/2^n$ is greater than a band of signals to be processed.

14. A method for digital to analog conversion, the method comprising the steps of:

generating an output bitstream from a $\Sigma\Delta$ demodulation stage; and reconstructing an analog signal from the output bitstream of the $\Sigma\Delta$ demodulation stage using a multirate low pass filter including a switched capacitor fully differential, double sampled input stage having two inputs, said input stage comprising two switched capacitors, means for inverting a connection of terminals of said two switched capacitors to the two inputs, and two delay blocks connected between said $\Sigma\Delta$ demodulation stage and one of said two inputs.

15. A method according to claim 14, wherein said multirate low pass filter further comprises at least one filter stage downstream from said input stage; and wherein the delay blocks introduce zeroes in a transfer function of said multirate low pass filter at frequencies of $f_s/2^n$ where n is an integer number whose value is within a range of 1 to $n_{max}$, $f_s$ is a frequency of the output bitstream of said $\Sigma\Delta$ demodulation stage, and $f_s/2^{nmax}$ is the clock frequency of said at least one filter stage downstream from said input stage.

* * * * *

UNITED STATES PATENT AND TRADEMARK OFFICE
CERTIFICATE OF CORRECTION

PATENT NO.    : 6,140,951
DATED         : October 31, 2000
INVENTOR(S)   : Nagari et al.

Page 1 of 1

It is certified that error appears in the above-identified patent and that said Letters Patent is hereby corrected as shown below:

Column 1,
Line 36, delete "$f_s$" insert -- $f_{ck}$ -- (first occurrence)
Line 37, delete "$f_s$" insert -- $f_{ck}$ -- (first occurrence)

In the Drawings:

FIG. 5, delete FIG. 5 as published, insert FIG. 5 as shown below

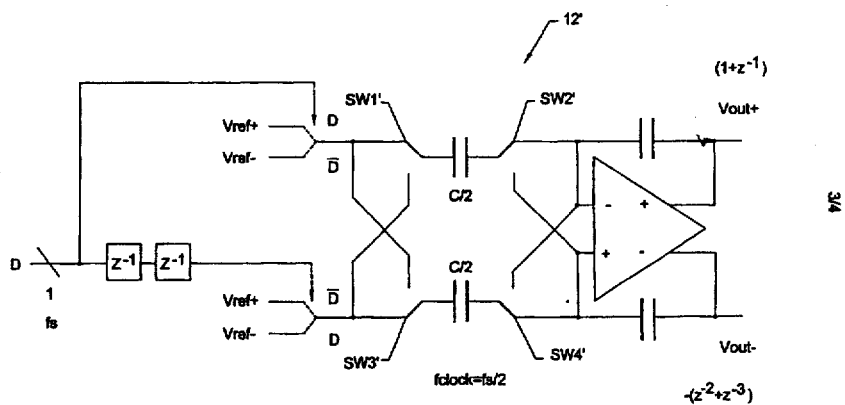

FIG. 5.

Signed and Sealed this

Twenty-fifth Day of September, 2001

Attest:

NICHOLAS P. GODICI
Attesting Officer    Acting Director of the United States Patent and Trademark Office